US005227673A

United States Patent [19]
Ta

[11] Patent Number: 5,227,673
[45] Date of Patent: Jul. 13, 1993

[54] DIFFERENTIAL OUTPUT BUFFER WITH FEEDBACK

[75] Inventor: Paul D. Ta, San Jose, Calif.

[73] Assignee: VLSI Technology, Inc., San Jose, Calif.

[21] Appl. No.: 612,172

[22] Filed: Nov. 13, 1990

[51] Int. Cl.5 .......................... H03K 3/26; H03K 3/01
[52] U.S. Cl. ................... 307/279; 307/272.3; 307/359; 307/296.8
[58] Field of Search ............... 307/264, 475, 272.3, 307/279, 592, 594, 296.5, 597, 359, 296.8

[56] References Cited

U.S. PATENT DOCUMENTS

| 3,944,848 | 3/1976 | Heeren | 307/205 |
|---|---|---|---|
| 4,156,940 | 5/1979 | Hollingsworth et al. | 307/296.8 |
| 4,585,957 | 4/1986 | Ooms | 307/455 |
| 4,670,673 | 6/1987 | Varaderajan | 307/264 |
| 4,695,750 | 9/1987 | Hara et al. | 307/264 |
| 4,716,313 | 12/1987 | Hori et al. | 307/475 |
| 4,719,369 | 1/1988 | Asano et al. | 307/475 |
| 4,719,372 | 1/1988 | Chappell et al. | 307/264 |
| 4,763,021 | 8/1988 | Stickel | 307/475 |
| 4,767,946 | 8/1988 | Taylor | 307/264 |
| 5,015,888 | 5/1991 | Ovens | 307/475 |

FOREIGN PATENT DOCUMENTS 0129217 6/1984 European Pat. Off. .
62-200819 9/1987 Japan .

Primary Examiner—William L. Sikes
Assistant Examiner—Toan Tran
Attorney, Agent, or Firm—The Hickman Law Firm

[57] ABSTRACT

A differential output buffer formed on a monolithic semiconductor substrate characterized by a bias generator coupled to a voltage source and a output stage coupled to the bias generator. The bias generator develops a bias output having a voltage level less than that of the voltage source. The output stage is responsive to a pair of complementary CMOS logic level inputs and uses the bias output of the bias generator to develop a pair of corresponding, low voltage swing outputs. In one embodiment the bias generator and the output stage operate in an open-loop and produce output signals which swing approximately two volts and in another embodiment the bias generator and the output stage operate in a closed-loop configuration and produce output signals which swing approximately one volt.

8 Claims, 4 Drawing Sheets

DIFFERENTIAL OUTPUT BUFFER WITH FEEDBACK

BACKGROUND OF THE INVENTION

This invention relates generally to electronic circuits and more particularly to differential buffers used in digital electronic circuits.

Digital electronic circuitry and, more particularly, highly integrated digital electronic circuitry is becoming faster, more complex, and more powerful with each succeeding generation. In very high speed digital circuitry, the ability to send signals between integrated circuit chips becomes limited by the capacitances and inductances of the leads and traces interconnecting the chips which cause noise and degrade performance. The design of input/output (I/O) circuits therefore becomes quite critical for high performance digital electronic circuits.

An I/O circuit well adapted for high-speed operation is the differential buffer which has previously been implemented as shown in FIG. 1A. In the prior art, a differential output buffer 10 includes a pair of digital inputs 12 and 13 and a pair of outputs 14 and 16. A differential input buffer 18 includes inputs 20 and 22 coupled to outputs 14 and 16 of differential output buffer 10 by lines 24 and 26, respectively, and digital outputs 28 and 29. Lines 24 and 26 are coupled to a power supply 30 by pull-up resistors 32 and 34, respectively. The power supply 30 is typically a separate, two-volt regulated power supply.

The signal on input line 12 of differential output buffer 10 is at typical CMOS logic levels, i.e. 0–5 volts d.c. When the input 12 is at 5 volts (i.e. a logical "HI" or "1") and input 13 is grounded at 0 volts (i.e. a logical "LO" or "0") an output transistor 36 of differential output buffer 10 is turned off and an output transistor 38 is turned on. This causes the output 14 of the differential output buffer 10 to be pulled up to two volts by resistor 32 while the output 16 of differential output buffer 10 goes to approximately one volt. When the signal on input 12 is at 0 volts and input 13 is at 5 volts transistor 36 is turned on pulling output 14 to approximately one volt while transistor 38 is turned off to cause resistor 34 to pull output 16 up to two volts.

In FIG. 1B, the signals on lines 24 and 26 are shown as the input signal on line 13 changes from 0 volts (LO) to 5 volts (HI) and the signal on line 12 changes from HI to LO. At a time $t_o$ the Q signal on output 16 is at approximately 1 volt while the $\overline{Q}$ signal on output 14 is approximately two volts. At a time $t_x$ the signal on input line 13 changes from LO to HI and on line 12 from HI to LO and the voltage levels on lines 24 and 26, respectively, reverse such that the voltage on line 24 goes to approximately one volt while the voltage on line 26 goes to 2 volts. The differential input buffer 18 is sensitive to the relative polarities of its inputs 20 and 22 to develop the CMOS logic levels on output 28, i.e. differential input buffer 18 performs the reverse function of differential output buffer 10.

The differential buffer circuit described in FIG. 1A has some distinct advantages. For one, the voltage levels on the lines connecting the differential output buffer 10 and the differential input buffer 18 only have to move along a voltage range of about 1 volt as opposed to the 5 volt voltage range of normal CMOS logic which permits a higher operating frequency for the digital circuitry. Furthermore, since the differential input buffer 18 is looking for a change in relative polarities between inputs 20 and 22, it can sense a switch in logic states soon after the cross-over between the Q and $\overline{Q}$ signals. As shown in FIG. 1B, the switch over can be at a time $t_x + dx$ at approximately $1.5 + dv$ volts. Furthermore, the differential buffer circuit is quite immune to the effects of noise on lines 24 and 26 because the differential input buffer 18 is sensitive to the relative polarities between the two lines and not to an absolute voltage level on either line.

Besides being faster and more immune to noise, differential buffer circuits are also advantageous in that they draw less power. There are generally two kinds of power loss within a digital electronic circuit. Static power loss is independent of the frequency of operation of the circuit and is essentially equal to $I_{bias} \times V_{dd}$. Dynamic power loss is frequency related and is equal to $CV^2f$, where C is the total capacitance, V is the voltage level, and f is the frequency of operation of the digital circuit. The total power is the sum of the static power and the dynamic power. Since both static and dynamic power are directly related to the voltage level, and since differential buffer circuits operate at a lower voltage level than typical CMOS logic, differential buffer circuits can substantially reduce the power requirements of the circuit.

While the prior art circuit of FIG. 1A works well to increase operating speed and noise immunity while decreasing power consumption it does have several disadvantages. For one, an expensive two-volt regulated power supply 30 is required for operation. Also, external pull-up resistors 32 and 34 are required which increase the component count and cost of the circuit as well as increasing the amount of printed circuit (PC) board real estate required to implement the circuit. Furthermore, the circuit of FIG. 1A results in a continuous current drain through one or the other of output transistors 36 and 38 which waste power and can lead to overheating problems with the output buffer chip.

SUMMARY OF THE INVENTION

The present invention solves the problems associated with prior art differential buffer circuits by providing an integrated differential output buffer having a low voltage swing. The output buffer is formed on a monolithic semiconductor substrate and includes both a bias generator and an output stage. The bias generator is coupled to a voltage source and develops a bias output having a voltage level less than that of the voltage source. The output stage is coupled to the bias output of the bias generator and to a pair of complementary input signals which vary from about ground to about five volts d.c., i.e. standard CMOS logic levels. In response to the input signals, the output stage develops a corresponding pair of complementary output signals which vary within a smaller voltage range. The more limited voltage swing of the output of the differential output buffer reduces power consumption and increases the speed of the circuitry.

A first embodiment of the present invention couples the bias generator to the output stage in an open-loop configuration. In this embodiment, the voltage range at the output of the output stage is from about ground to about one and a half volts. In a second embodiment of the present invention the bias generator is coupled to the output stage in a closed-loop or feedback configuration and the voltage range at the output of the output stage is from about ground to about one volt. The second embodiment of the present invention consumes even less power and is even faster than the first embodiment because of its very limited voltage swing.

The monolithic construction of the differential output buffer of the present invention eliminates the requirements for an external, low voltage power supply and for pull-up resistors. This decreases the component count, cost and the amount of P.C. board real estate required to implement a desired digital circuit. Also, since the present differential output buffer does not drain current through the output transistors of the chip, much less power is consumed by the buffer and overheating problems are minimized.

These and other advantages of the present invention will become clear to those skilled in the art upon a study of the detailed description of the invention and of the several figures of the drawings.

BRIEF DESCRIPTION OF THE DRAWINGS

FIG. 1b is a diagram of the signals on lines 24 and 26 of FIG. 1a.

DETAILED DESCRIPTION OF THE PREFERRED EMBODIMENTS

Figure 1A:
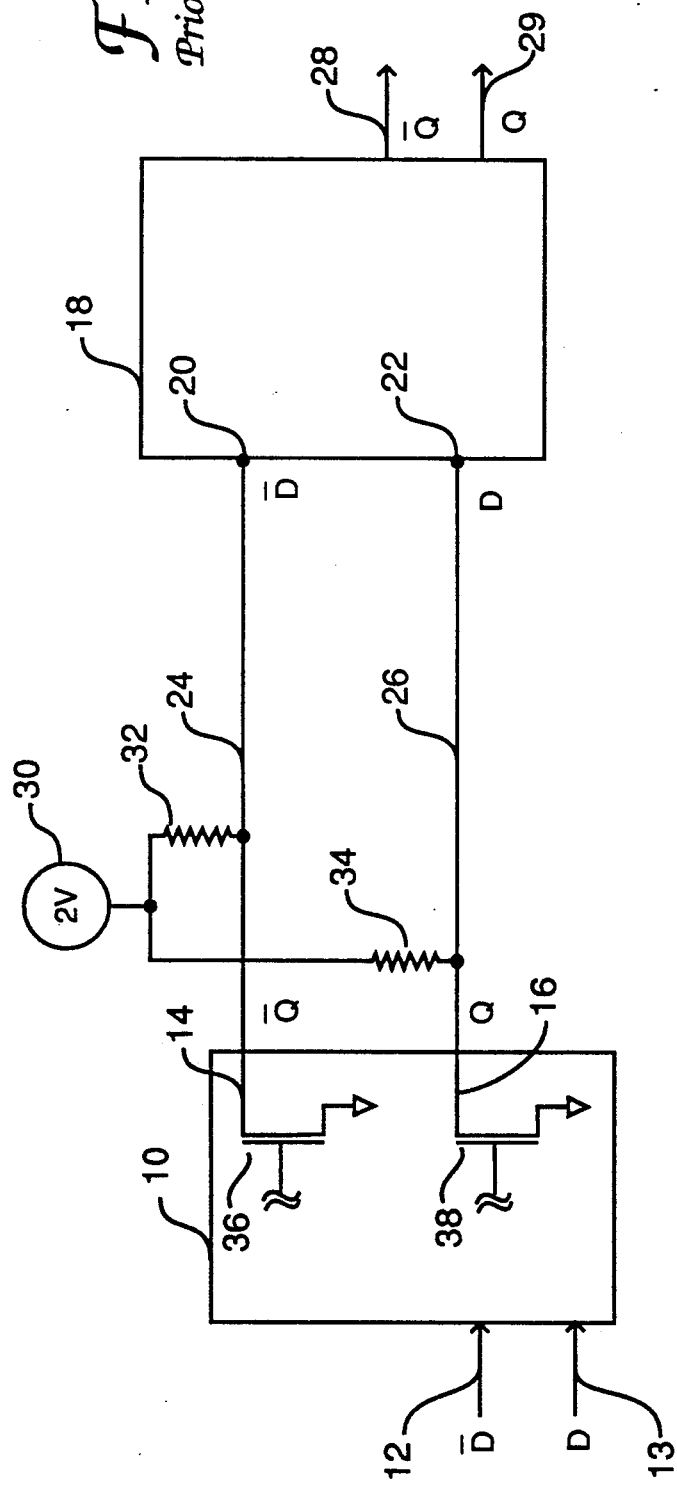
FIG. 1a is a block diagram of a prior art differential buffer circuit.

A prior art differential buffer circuit was described with reference to FIGS. 1A and 1B. In FIG. 2, a high speed differential output buffer in accordance with the present invention includes a bias generator 42 and a output stage 44. The circuit of FIG. 2 is preferably implemented in Complementary Metal Oxide Semiconductor (CMOS) technology.

The bias generator 42 of the differential output buffer 40 includes twelve Metal Oxide Semiconductor Field Effect Transistors (MOSFETS) 46-66. A power line 68 is coupled to positive power supply line $V_{dd}$ and a ground line 70 is coupled to negative power supply line $V_{ss}$. The voltage differential between $V_{dd}$ and $V_{ss}$ is typically +5 volts, with $V_{ss}$ being at ground potential.

MOSFETS 46-50 develop a control signal on a line 72 which is coupled to the gates of MOSFETS 51, 56, and 60 to provide constant current sources of approximately 20 microamperes on lines 74, 76, and 78. The 20 microamperes of current flowing down line 74 towards ground line 70 is dropped first across MOSFET 52 and then across MOSFET 54. Since the voltage drop across MOSFETS 52 and 54 is approximately $V_t+dv$ each, the voltage on line 80 will be $2(V_t+dv)$ or, approximately, 2 volts. $V_t$ is the threshold voltage for the MOSFETS while dv is given by the relationship $$dv = sqrt[(2I_d)/(BS)]$$

where $I_d$, in this example, is 20 microamperes. The variable B in the above equation is given by $B = mc_{ox}$ where m is the mobility of the charge carriers and $c_{ox}$ is the gate capacitance of the MOSFETS. The variable S in the above equation is given by $S = w/l$ where w is the width of the MOSFET gates and l is the length of the MOSFET gates.

MOSFETS 56-66 increase the noise immunity of the bias generator 42, and further protect against pump back by external capacitive elements. As mentioned previously, MOSFETS 56 and 60 serve as constant current sources to provide approximately 20 microamperes of current on lines 76 and 78. MOSFET 62 is configured as a source-follower so that any noise on line 80 will be reflected on a line 82 which, in turn, controls the bias on the gate of MOSFET 58. MOSFET 58 will counteracts the noise on line 80 by pulling down the voltage for positive noise spikes and letting the voltage rise for negative noise spikes. MOSFET 66 has its source and drain coupled together to serve as a capacitor and is coupled to the line 80 at a node 84 to provide a filtering function for line 80. The line 80 splits into a pair of lines 80A and 80B at node 84 to provide a regulated voltage source for output stage 44.

The output stage 44 includes six MOSFETS 86-96. The output stage for 44 has two inputs, namely a D input on a line 98 and a $\overline{D}$ input on a line 100. The signals D and $\overline{D}$ are, of course, inverses of each other and range in voltage levels from 0 to 5 volts. When D is low, MOSFET 86 will be turned on and MOSFET 90 will be turned off causing $\overline{Q}$ output line 102 to attain a voltage level of approximately $V_t+2\,dv$ volts. At the same time, $\overline{D}$ is high, turning off MOSFET 92 and turning on MOSFET 96 to pull down output line 104 to ground. When the signals on input lines 98 and 100 are reversed, a high logic level at the D input will turn off MOSFET 86 and turn on MOSFET 90 pulling the output line 102 to ground, while a low logic level on the $\overline{D}$ input will turn on MOSFET 92 and turn off MOSFET 96, causing output line 104 to reach approximately the voltage level $V_t+2\,dv$.

Figure 1B:
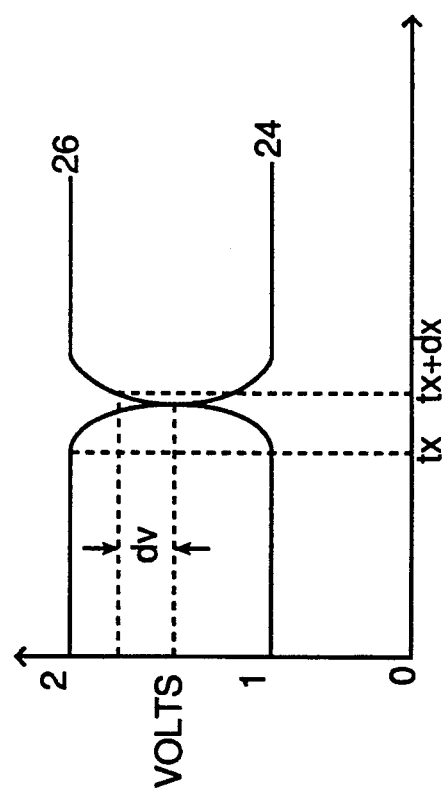
Figure 2:
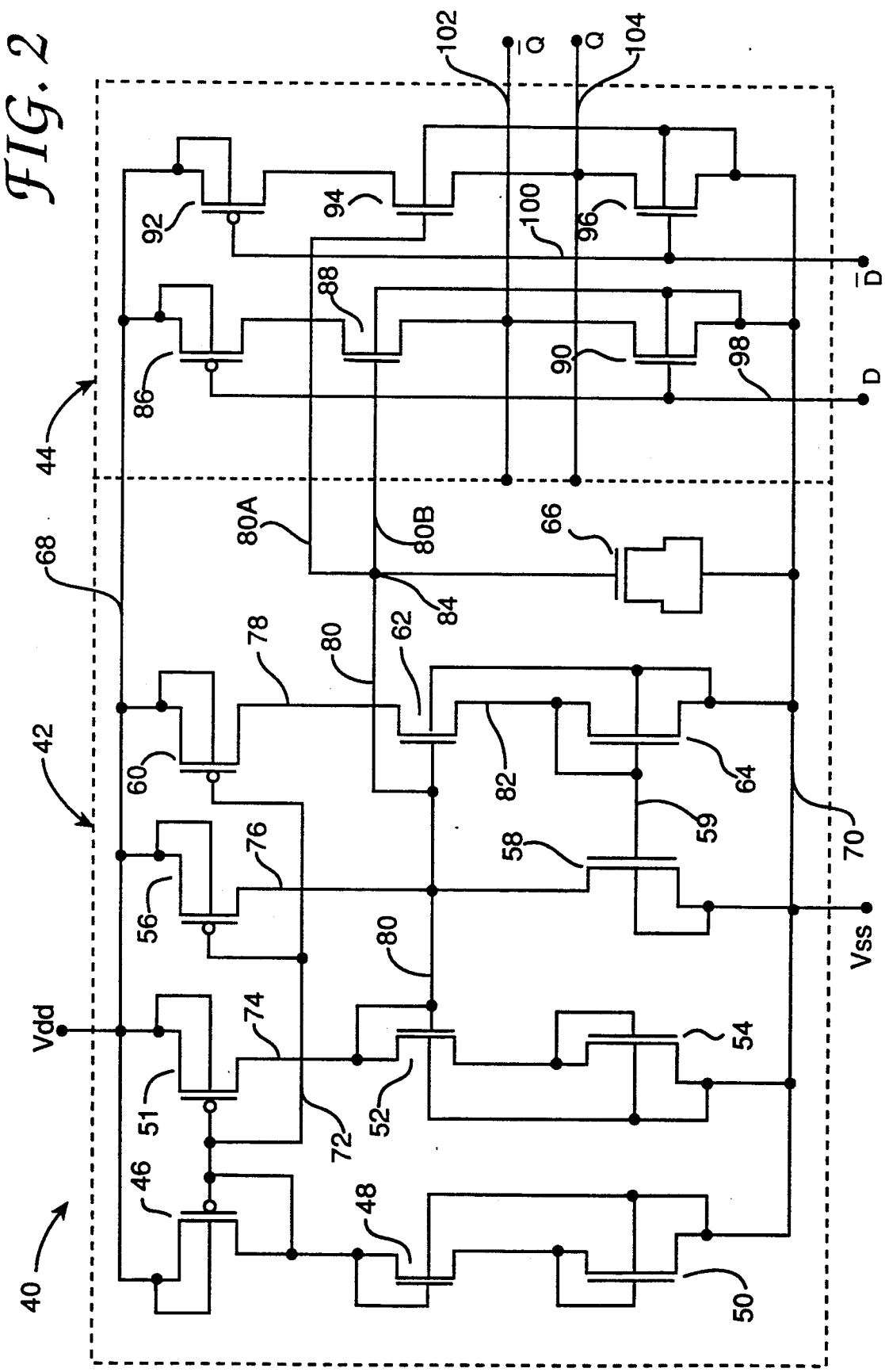
FIG. 2 is a schematic of a differential output buffer in accordance with the present invention including a bias generator 42 and an output stage 44.

The circuit of FIG. 2 is very advantageous in that it does not require an external power supply such as the one necessary for the operation of the circuit of FIG. 1A. This circuit also does not require the use of external pull-up resistors which can increase the cost, size and heat dissipation of the digital electronic circuitry. As a consequence, the circuit of FIG. 2 consumes less power, has a lower component count and is more reliable than circuitry in the prior art which perform the same function.

It should be noted that bias generator 42 and output stage 44 of differential output buffer 40 operate in an open-loop fashion. In other words, the voltage level on line 80 of bias generator 42 is substantially unaffected by feed-back from the output stage 44. A closed-loop configuration for a bias generator will be discussed below with reference to FIG. 3.

Figure 3:
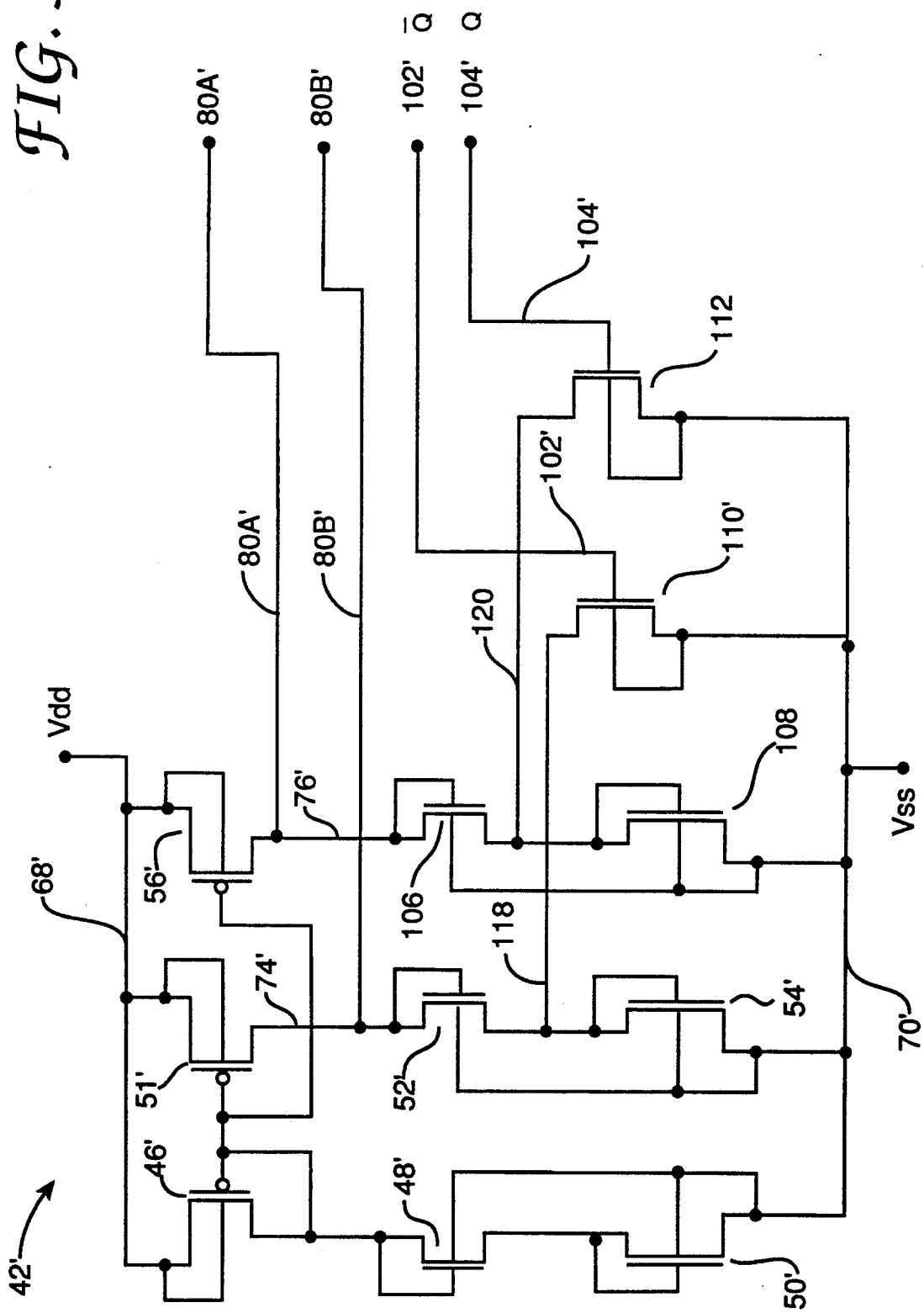
FIG. 3 is a schematic of an alternate embodiment 42' of the bias generator 42 of the differential output buffer of FIG. 2.

Referring now to FIG. 3, an alternate embodiment of a bias generator 42' is shown. In this embodiment, components which correspond to the components of the bias generator 42 of FIG. 2 will be indicated by a corresponding primed numeral. The bias generator 42' includes a power line 68', a ground line 70', low voltage lines 80A' and 80B', and output lines 102' and 104'. MOSFETS 46'-56' are interconnected and operated substantially in the same manner as previously described with reference to bias generator 42.

MOSFETS 106 and 108 of bias generator 42' are coupled to the constant current line 76' in the same fashion as MOSFETS 52' and 54' are coupled to constant current line 74'. A line 118 couples MOSFETS 52' and 54' to MOSFET 110, while a line 120 couples MOSFETS 106 and 108 to MOSFET 112. The gate of MOSFET 110 is coupled to output line 102', while the gate of MOSFET 112 is coupled to output line 104'. The bias lines 80A' and 80B' are coupled to lines 76' and 74', respectively.

The bias generator 42' reduces the voltage swing at the outputs of the differential output buffer, thereby greatly reducing power consumption. This is accomplished by a feedback of the voltage levels on lines 102' and 104' to MOSFETS 110 and 112. In other words, the bias generator 42' operates with output stage 44 (or the output stage 44' of FIG. 4) in a closed-loop fashion. When the voltage level on line 102' reaches $V_t$ (approximately 1 V) MOSFET 110 is turned on to cause MOSFET 52' to pull down line 80B' to $V_t + dv$ which, as a consequence, prevents line 102' from rising above $V_t$. Similarly, when the voltage level on line 104' reaches $V_t$ MOSFET 112 is turned on to cause MOSFET 106 to pull down line 80A' to $V_t + dv$, holding line 104' to $V_t$. Therefore, when bias generator 42' is used with the output stage 44 of FIG. 2, the voltage range on the Q and $\overline{Q}$ outputs will range from ground to $V_t$, i.e. from approximately 0 to 1 volts, which will consume considerably less power than the typical CMOS swing of 0 to 5 volts.

Figure 4:
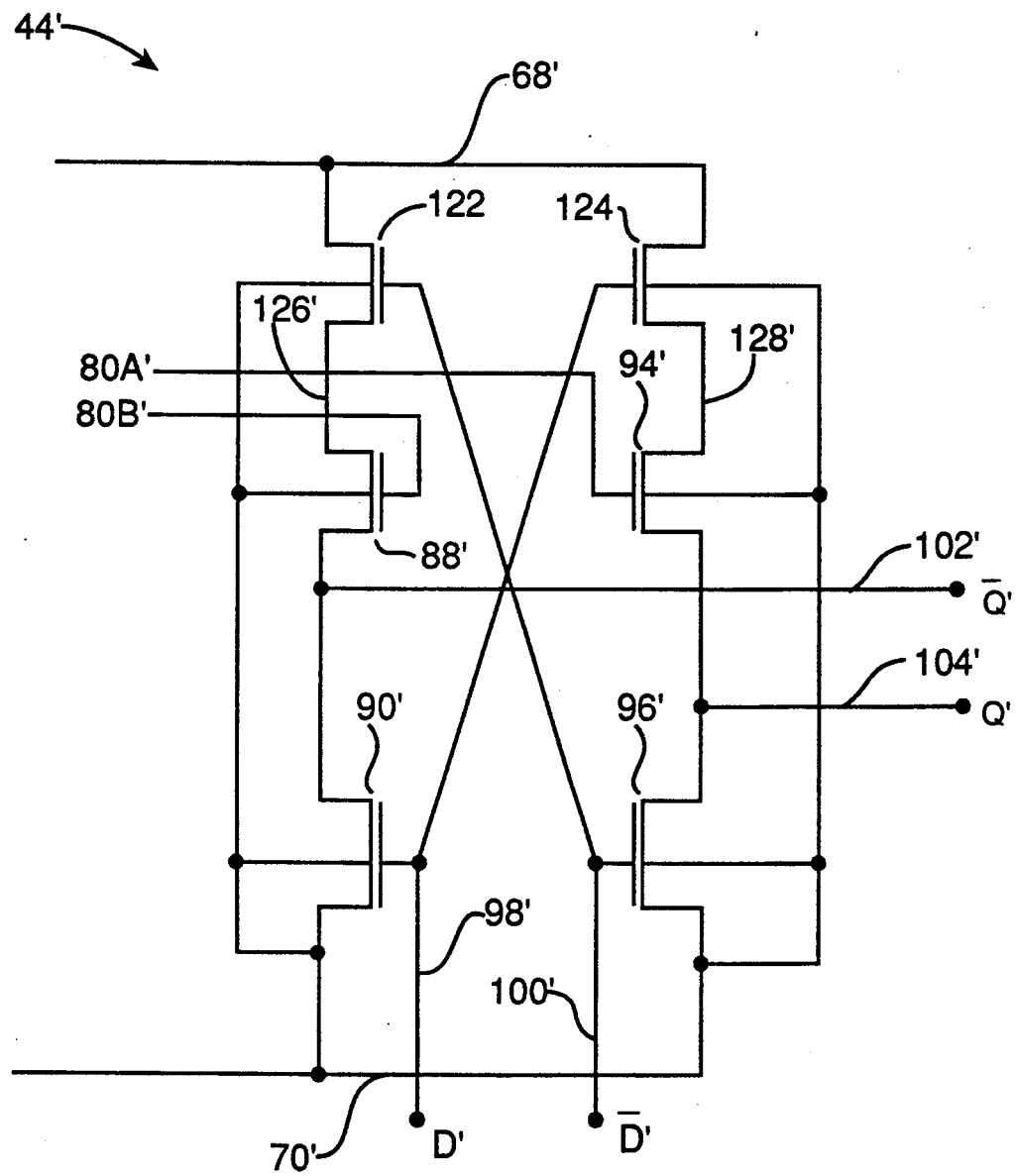
FIG. 4 is a schematic of an alternate embodiment 44' of the output stage 44 of the differential output buffer of FIG. 2.

In FIG. 4, an alternate embodiment 44' of the output stage 44 of FIG. 2 is shown. Again, components which correspond to the components of the output stage 42 of FIG. 2 will be indicated by a corresponding primed numeral. The output stage 44' is essentially the all N-channel equivalent of the output stage 44 of FIG. 2. This all N-channel version tends to be faster than the CMOS version of FIG. 2 because electrons tend to move faster through N-channels than holes do through P-channels. The output stage 44' includes MOSFETS 88', 90', 94', and 96' which are interconnected substantially identically to that of output stage 44. In the drawing of FIG. 4, however, MOSFETS 88' and 90' have been drawn in a reverse image to simplify the schematic.

Output stage 44' also includes MOSFETS 122 and 124. These are connected in a source-follower configuration which causes the voltage levels on lines 126 and 128 to move much less, i.e. from ground to $V_{dd} - V_t$ rather than from ground to $V_{dd}$ in the equivalent lines in the output stage 44 of FIG. 2. This increases the speed of the circuit and reduces power consumption. The gates of MOSFETS 122 and 96' are coupled together as are the gates of MOSFET 90' and 124.

When a LO logic level is applied to data input D', MOSFETS 90' and 124 are shut off. At the same time, the complimentary logic level on data input $\overline{D}'$ turns on MOSFETS 96' and 122. This causes the Q' output to go to ground while the $\overline{Q}'$ output will rise to approximately one volt. In the reverse situation, a HI logic level on input D' will turn on MOSFETS 90' and 124 while the LO logic level on $\overline{D}'$ will turn off MOSFETS 96' and 122. This will cause the Q' output to rise to approximately one volt while the $\overline{Q}'$ output will approach ground potential.

While this invention has been described in terms of several preferred embodiments, it is contemplated that various alterations and permutations thereof will become apparent to those skilled in the art. For example, while the best mode known to the inventor is to practice this invention in CMOS technology, analogous technologies such a n-channel MOS or p-channel MOS can also be used. It is therefore intended that the appended claims include all such alterations and permutations as fall within the true spirit and scope of the present invention.

What is claimed is:

1. A differential output buffer comprising:
   a monolithic semiconductor substrate;
   a bias generator formed on said substrate to produce and issue at least a first bias generator output signal; and
   an output stage formed on said substrate and coupled to said bias generator to receive the first bias generator output signal said output stage being responsive to a first input signal, which varies in a first voltage range from about zero volts to about five volts, and a second input signal that is the logical inverse of the first input signal, and being operative to produce a corresponding output signal which varies in a second voltage range from about zero volts to about two volts;
   wherein said bias generator and said output stage are coupled together so that said bias generator receives feedback from and depends upon said output stage output signal to regulate the first bias generator output signal; and
   wherein said buffer requires the provision of at most two power supply voltage levels.

2. A differential output buffer comprising:
   a bias generator coupled to a voltage source, said bias generator developing a bias output having a voltage having a voltage level less than that of said voltage source; and
   an output stage coupled to said bias output of said bias generator to receive said bias output said output stage being responsive to a first input signal, which varies in a first voltage range, and a second input signal that is the logical inverse of the first input signal, and being operative to produce a corresponding output signal, which varies in a second voltage range which is smaller than said first voltage range, and a second output signal that is the logical inverse of the first output signal, wherein said bias generator output signal depends on said output stage output signals, and wherein said bias generator includes means for regulating the voltage level of said bias output which is responsive to feedback from said output stage;
   wherein said buffer requires the provision of at most two power supply voltage levels.

3. A differential output buffer comprising:
   a bias generator coupled to a voltage source, said bias generator developing two bias outputs, each having a voltage having a voltage level less than that of said voltage source; and
   an output stage coupled to said bias output of said bias generator to receive said two bias outputs, said output stage being responsive to a first input signal, which varies in a first voltage range, and a second input signal that is the logical inverse of the first input signal, and being operative to produce a corresponding output signal which varies in a second voltage range which is smaller than said first voltage range, wherein said bias generator is responsive to feedback from said output stage to regulate said bias outputs;
   wherein said buffer requires the provision of at most two power supply voltage levels.

4. A differential output buffer comprising:

a monolithic semiconductor substrate;

a bias generator formed on said substrate to produce and issue a bias generator output signal;

an output stage formed on said substrate and coupled to said bias generator to receive said bias generator output signal, said output stage being responsive to a first input signal, which varies in a first voltage range from about zero volts to about five volts, and a second input signal that is the logical inverse of the first input signal, and being operative to produce a corresponding first output signal, which varies in a second voltage range from about zero volts to a voltage greater than $V_t$ but less than $2 V_t$, where $V_t$ is the threshold voltage of a transistor of said output stage, and a second output signal that is the logical inverse of the first output signal;

wherein said bias generator receives feedback from and depends upon said output signals from said output stage; and wherein said buffer requires the provision of at most two power supply voltage levels.

5. A differential output buffer comprising:

a monolithic semiconductor substrate;

a bias generator formed on said substrate to produce and issue at least a first bias generator output signal; and an output stage formed on said substrate and coupled to said bias generator, said output stage being responsive to a first input signal, which varies in a first voltage range from about zero volts to about five volts, and a second input signal that is the logical inverse of the first input signal, and being operative to produce a corresponding output signal which varies in a second voltage range from about zero volts to about two volts;

wherein said buffer requires the provision of at most two power supply voltage levels; and wherein said output stage has at least a first control input terminal connected to said bias generator output signal, has first and second data input terminals and has first and second data output terminals, and wherein said bias generator further comprises:

a first transistor having a source terminal, a drain terminal and a gate terminal, with its drain terminal connected to a first voltage source having a selected first voltage value and its source terminal connected to its gate terminal;

a second transistor having a source terminal, a drain terminal and a gate terminal, with its drain terminal connected to its gate terminal and to the source terminal of the first transistor;

a third transistor having a source terminal, a drain terminal and a gate terminal, with its drain terminal connected to its gate terminal and to the source terminal of the second transistor, and with its source terminal connected to a second voltage source having a selected second voltage value that is less than the first voltage value;

a fourth transistor having a source terminal, a drain terminal and a gate terminal, with its drain terminal connected to the first voltage source;

a fifth transistor having a source terminal, a drain terminal and a gate terminal, with its drain terminal connected to its gate terminal and to the source terminal of the fourth transistor;

a sixth transistor having a source terminal, a drain terminal and a gate terminal, with its drain terminal connected to its gate terminal and to the source terminal of the fifth transistor, and with its source terminal connected to the second voltage source;

a seventh transistor having a source terminal, a drain terminal and a gate terminal, with its drain terminal connected to the first voltage source;

an eighth transistor having a source terminal, a drain terminal and a gate terminal, with its drain terminal connected to the source terminal of the seventh transistor and its source terminal connected to the second voltage source;

a ninth transistor having a source terminal, a drain terminal and a gate terminal, with its drain terminal connected to the first voltage source, and with its gate terminal connected to the gate terminals of the first, fourth and seventh transistors;

a tenth transistor having a source terminal, a drain terminal and a gate terminal, with its drain terminal connected to the source terminal of the ninth transistor, and with its gate terminal connected to the gate terminal of the fifth transistor and to the source terminal of the seventh transistor;

an eleventh transistor having a source terminal, a drain terminal and a gate terminal, with its drain terminal connected to its gate terminal, to the gate terminal of the eighth transistor and to the source terminal of the tenth transistor, its source terminal connected to the substrates of the tenth and eleventh transistors and to the second voltage source; and a twelfth transistor having a source terminal, a drain terminal and a gate terminal, with its drain terminal connected to its source terminal and to the second voltage source and with its gate terminal connected to the gate terminal of the tenth transistor;

where said bias generator has an output signal terminal connected to the gate terminal of the twelfth transistor.

6. A differential output buffer as recited in claim 5, wherein said output stage further comprises a thirteenth transistor having a source terminal, a drain terminal and a gate terminal, with its drain terminal connected to said first voltage source and with its gate terminal connected to the first data input terminal of said output stage;

a fourteenth transistor having a source terminal, a drain terminal and a gate terminal, with its drain terminal connected to the source terminal of the thirteenth transistor, with its gate terminal connected to the first control input terminal;

a fifteenth transistor having a source terminal, a drain terminal and a gate terminal, with its drain terminal connected to the source terminal of the fourteenth transistor and to the first data output terminal of said output stage, with its gate terminal connected to the first data input terminal and to the gate terminal of the thirteenth transistor, and with its source terminal connected to the second voltage source;

a sixteenth transistor having a source terminal, a drain terminal and a gate terminal, with its drain terminal connected to the first voltage source and with its gate terminal connected to the second data input terminal;

a seventeenth transistor having a source terminal, a drain terminal and a gate terminal, with its drain terminal connected to the source terminal of the sixteenth transistor and with its gate terminal connected to the first control input terminal; and an eighteenth transistor having a source terminal, a drain terminal and a gate terminal, with its drain terminal connected to the source terminal of the seventeenth transistor and to the second output terminal of said output stage, with its gate terminal connected to the second data input terminal of said output stage, and with its source terminal connected to the second voltage source.

7. A differential output buffer comprising:

a monolithic semiconductor substrate;

a bias generator formed on said substrate to produce and issue at least a first bias generator output signal; and an output stage formed on said substrate and coupled to said bias generator, said output stage being responsive to a first input signal, which varies in a first voltage range from about zero volts to about five volts, and a second input signal that is the logical inverse of the first input signal, and being operative to produce a corresponding output signal which varies in a second voltage range from about zero volts to about two volts;

wherein said buffer requires the provision of at most two power supply voltage levels; and wherein said bias generator produces and issues first and second bias generator output signals, wherein said output stage has at least a first control input terminal connected to said bias generator output signal, has first and second data input terminals and has first and second data output terminals, and wherein said bias generator further comprises:

a first transistor having a source terminal, a drain terminal and a gate terminal, with its drain terminal connected to a first voltage source having a selected first voltage value and its source terminal connected to its gate terminal;

a second transistor having a source terminal, a drain terminal and a gate terminal, with its drain terminal connected to its gate terminal and to the source terminal of the first transistor;

a third transistor having a source terminal, a drain terminal and a gate terminal, with its drain terminal connected to its gate terminal and to the source terminal of the second transistor, and with its source terminal connected to a second voltage source having a selected second voltage value that is less than the first voltage value;

a fourth transistor having a source terminal, a drain terminal and a gate terminal, with its drain terminal connected to the first voltage source;

a fifth transistor having a source terminal, a drain terminal and a gate terminal, with its drain terminal connected to its gate terminal and to the source terminal of the fourth transistor;

a sixth transistor having a source terminal, a drain terminal and a gate terminal, with its drain terminal connected to its gate terminal and to the source terminal of the fifth transistor, and with its source terminal connected to the second voltage source;

a seventh transistor having a source terminal, a drain terminal and a gate terminal, with its drain terminal connected to the first voltage source and its gate terminal connected to the gate terminals of the first and fourth transistors;

an eighth transistor having a source terminal, a drain terminal and a gate terminal, with its drain terminal connected to its gate terminal and to the source terminal of the seventh transistor;

a ninth transistor having a source terminal, a drain terminal and a gate terminal, with its drain terminal connected to its gate terminal and to the source terminal of the eighth transistor, and with its source terminal connected to the second voltage source;

a tenth transistor having a source terminal, a drain terminal and a gate terminal, with its drain terminal connected to the drain terminal of the sixth transistor, and with its source terminal connected to the second voltage source;

an eleventh transistor having a source terminal, a drain terminal and a gate terminal, with its drain terminal connected to the drain terminal of the ninth transistor, and with its source terminal connected to the second voltage source;

where said bias generator has first and second output signal lines connected to the drain terminals of the fifth and eighth transistors, respectively, and where the gate terminals of the tenth and eleventh transistors are connected to the first and second data output terminals of the output stage.

8. A differential output buffer as recited in claim 7, wherein said output stage further comprises:

a twelfth transistor having a source terminal, a drain terminal and a gate terminal, with its drain terminal connected to said first voltage source;

a thirteenth transistor having a source terminal, a drain terminal and a gate terminal, with its drain terminal connected to the source terminal of the twelfth transistor and with its gate terminal connected to said second bias generator output line;

a fourteenth transistor having a source terminal, a drain terminal and a gate terminal, with its drain terminal connected to the source terminal of the thirteenth transistor and with its source terminal connected to said second voltage source;

a fifteenth transistor having a source terminal, a drain terminal and a gate terminal, with its drain terminal connected to said first voltage source and with its gate terminal connected to the gate terminal of the fourteenth transistor and to said first data input terminal of said output stage;

a sixteenth transistor having a source terminal, a drain terminal and a gate terminal, with its drain terminal connected to the source terminal of the fifteenth transistor and with its gate terminal connected to said first bias generator output line;

a seventeenth transistor having a source terminal, a drain terminal and a gate terminal, with its drain terminal connected to the source terminal of the sixteenth transistor, with its gate terminal connected to the gate terminal of the twelfth transistor and to said second data input terminal of said output stage, with its source terminal connected to said second voltage source;

where the drain terminals of the fourteenth and seventeenth terminals are connected to said first and second data output lines, respectively, of said output stage.

* * * * *